United States Patent
Aikawa et al.

(10) Patent No.: US 7,721,411 B2
(45) Date of Patent: May 25, 2010

(54) METHOD OF MANUFACTURING AN ACOUSTIC WAVE DEVICE

(75) Inventors: Shunichi Aikawa, Yokohama (JP); Jyouji Kimura, Yokohama (JP); Keiji Tsuda, Yokohama (JP); Kazunori Inoue, Kawasaki (JP); Takashi Matsuda, Kawasaki (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 11/987,175

(22) Filed: Nov. 28, 2007

(65) Prior Publication Data

US 2008/0122318 A1 May 29, 2008

(30) Foreign Application Priority Data

Nov. 28, 2006 (JP) ............................. 2006-320892

(51) Int. Cl.
*H04R 31/00* (2006.01)
(52) U.S. Cl. ...................... 29/594; 29/25.35; 29/417; 29/609.1; 310/320; 310/366; 333/150; 333/187; 333/193; 333/195; 333/196
(58) Field of Classification Search ................ 29/25.35, 29/417, 594, 595, 609.1, 835, 841, 844, 855; 310/313, 320, 366; 333/150, 187, 193, 195, 333/196
See application file for complete search history.

(56) References Cited

U.S. PATENT DOCUMENTS 5,325,573 A * 7/1994 Miyashita et al. .......... 29/25.35

FOREIGN PATENT DOCUMENTS

| JP | 11-026394 A | 1/1999 |
|----|-------------|--------|
| JP | 2002-141762 A | 5/2002 |
| JP | 2003-188669 A | 7/2003 |
| JP | 2004-56036 A | 2/2004 |

\* cited by examiner

*Primary Examiner*—Paul D Kim
(74) *Attorney, Agent, or Firm*—Arent Fox LLP (57) ABSTRACT

A method of manufacturing an acoustic wave device includes: forming a conductive pattern on a wafer made of a piezoelectric substrate having an acoustic wave element, the conductive pattern including a first conductive pattern being continuously formed on a cutting region for individuating the wafer, a second conductive pattern being formed on an electrode region where a plated electrode is to be formed and being connected to the acoustic wave element and a third conductive pattern connecting the first conductive pattern and the second pattern; forming an insulating layer on the wafer so as to have an opening on the second conductive pattern; forming the plated electrode on the second conductive pattern by providing an electrical current to the second conductive pattern via the first conductive pattern and the third conductive pattern; and cutting off and individuating the wafer along the cutting region.

5 Claims, 8 Drawing Sheets

Prior Art

FIG. 2B

Prior Art

METHOD OF MANUFACTURING AN ACOUSTIC WAVE DEVICE

BACKGROUND OF THE INVENTION

1. Field of the Invention

The present invention relates to an acoustic wave device and a method of manufacturing the acoustic wave device, in particular, relates to an acoustic wave device that has an electrode connected to an acoustic wave element and a method of the acoustic wave device.

2. Description of the Related Art

An acoustic wave device is widely used as a signal filter of an electrical and electronic device using an electromagnetic wave. The acoustic wave device is used as a transmitting and receiving filter of a radio communication device such as a mobile phone or a frequency filter for visual such as a television or a videotape recorder. A surface acoustic wave element or a boundary acoustic wave element is used as an acoustic wave element. A surface acoustic wave element has a structure in which an electrode exciting a surface acoustic wave such as a comb electrode is provided on a piezoelectric substrate made of $LiNbO_3$, $LiTaO_3$ or the like. It is necessary to form a space on the piezoelectric substrate and on the electrode, because the surface acoustic wave propagates on a surface of the piezoelectric substrate. It is necessary to seal the acoustic wave element in order to gain trust, because there is not provided a thick protective membrane on the piezoelectric substrate and on the electrode.

On the other hand, a boundary acoustic wave element has a dielectric material on a comb electrode, and uses a boundary acoustic wave propagating between a piezoelectric substrate and the dielectric material. A space on the comb electrode may not be formed. The acoustic wave device may have an external connection terminal for inputting and outputting an electrical signal from and to outside. In the structure, an electrode is formed with a plating method, if a thick electrode is necessary as an external connection terminal.

Figure 1A:
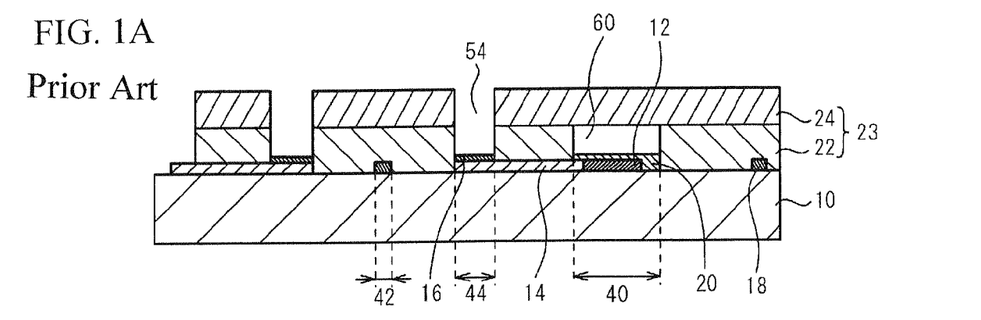
FIG. 1A through FIG. 1D illustrate a manufacturing process of an acoustic wave device in accordance with a conventional embodiment.

As shown in FIG. 1A through FIG. 2B, a description will be given of a conventional embodiment in which a plated electrode connected to a surface acoustic wave element or a boundary acoustic wave element is formed. As shown in FIG. 1A, a comb electrode 12 is formed on a piezoelectric substrate 10. A conductive pattern 14 connected to the comb electrode 12 is formed on an electrode region 44 where a plated electrode is to be formed. A first conductive pattern 18 is formed on a cutting region 42 for individuating a wafer. A barrier layer 16 is formed on the conductive pattern 14 in the electrode region 44. A protective membrane 20 is formed on the comb electrode 12. A cavity 60 is formed on a functional region 40 of a surface acoustic wave element. A sealing portion 23 (a first sealing portion 22 and a second sealing portion 24) is formed on the piezoelectric substrate 10 so that the electrode region 44 acts as a non-covered portion 54.

Figure 1B:
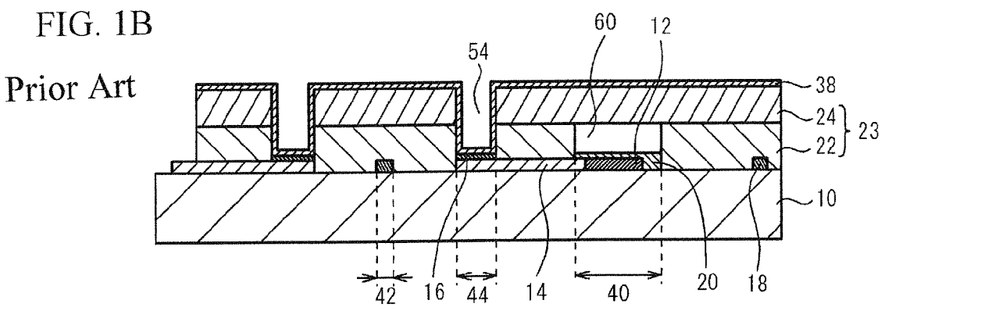
Figure 1C:
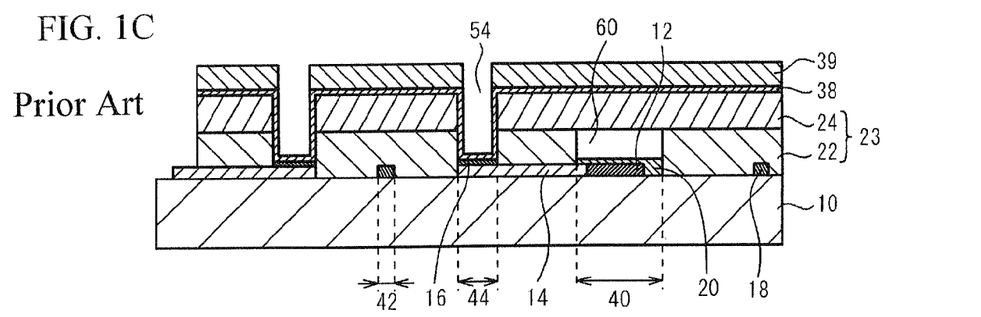
Figure 1D:
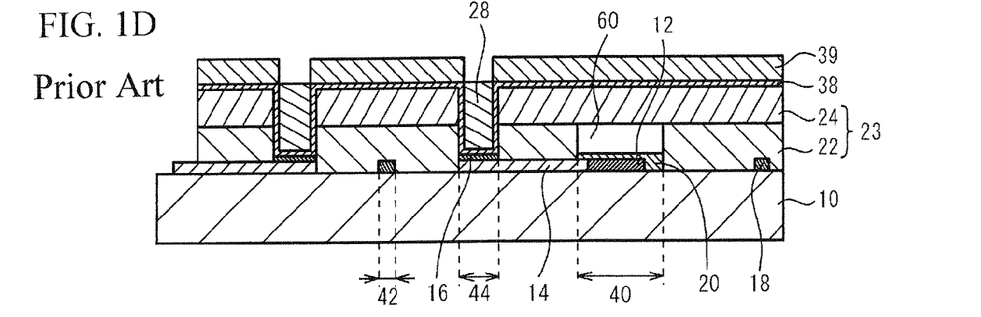

As shown in FIG. 1B, a seed layer 38 is formed on the second sealing portion 24 and in the non-covered portion 54. As shown in FIG. 1C, a photo resist 39 is formed on the seed layer 38 except in the non-covered portion 54. As shown in FIG. 1D, an inner side of the non-covered portion 54 is plated when an electrical current is provided to the inner side of the non-covered portion 54 via the seed layer 38. This results in a formation of a plated electrode 28.

In the conventional embodiment, it is preferable that the plated electrode 28 is formed with a plating method, because the plated electrode 28 passes through the sealing portion 23 having a cavity. It is necessary to provide an electrical current to a pattern where a plated electrode is to be formed if an electroplating method having a high plating speed is used. And so, the seed layer 38 is provided on the sealing portion 23 as shown in FIG. 1B.

Japanese Patent Application Publication No. 11-26394 and Japanese Patent Application Publication No. 2004-56036 disclose a method of forming a plated electrode with a seed layer as shown in the conventional embodiment.

Figure 2A:
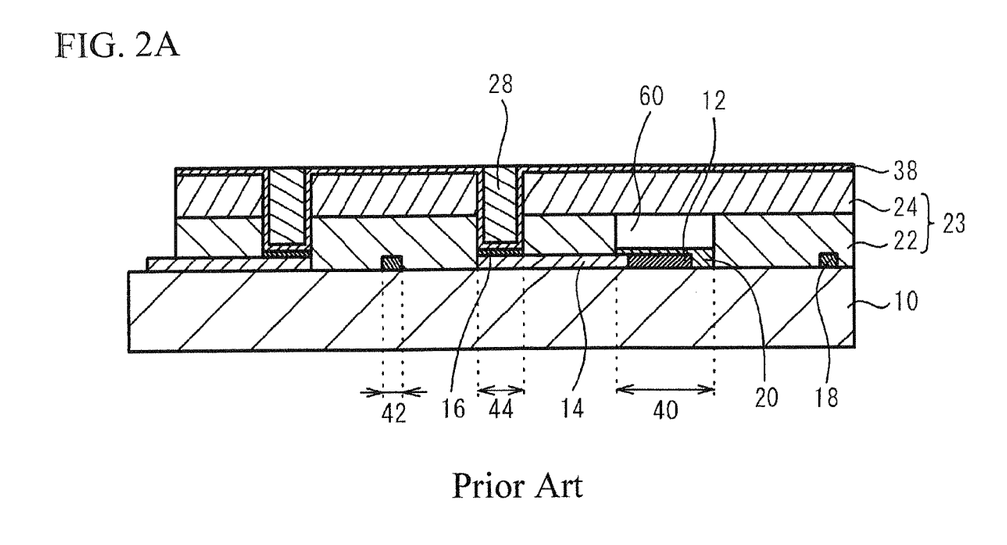
FIG. 2A through FIG. 2B illustrate the manufacturing process of the acoustic wave device in accordance with the conventional embodiment.
Figure 2B:
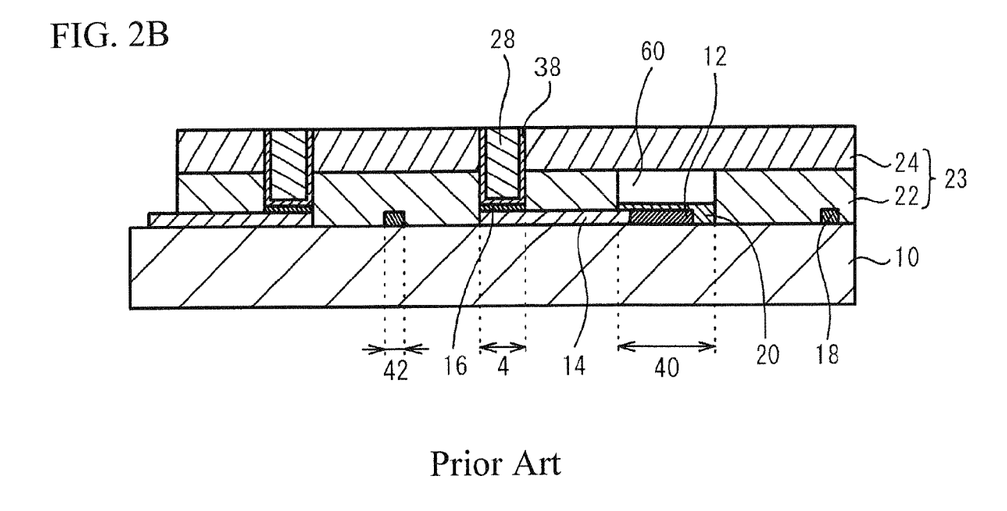
Figure 2E:
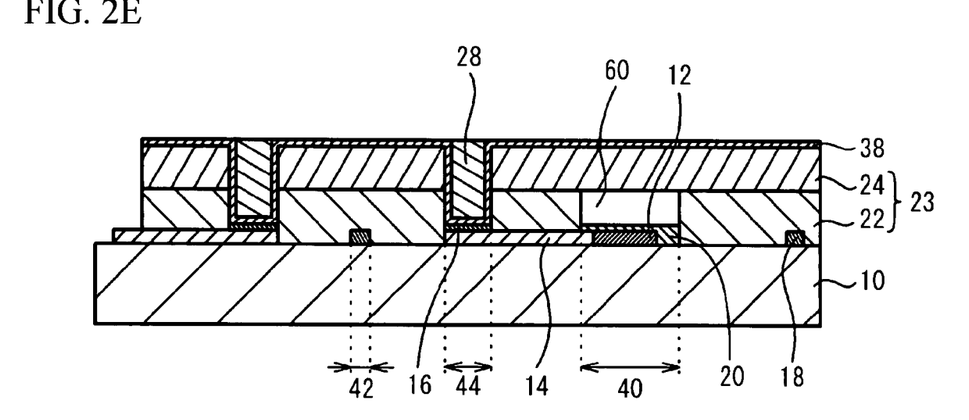
Figure 2F:
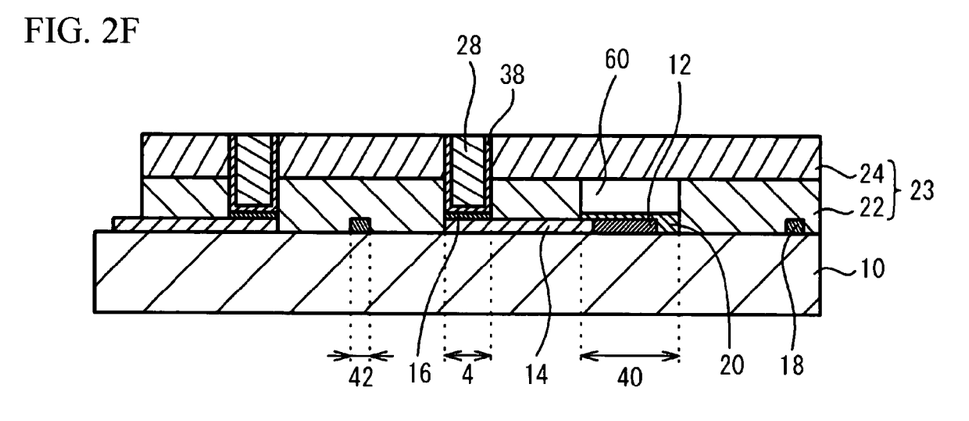

The conventional embodiment needs complicated steps of forming the seed layer 38 as shown in FIG. 1B, forming the photo resist for selectively plating as shown in FIG. 1C, removing the photo resist 39 as shown in FIG. 2A and removing the seed layer 38 as shown in FIG. 2B. There is a case where the piezoelectric substrate 10 is damaged when the seed layer 38 or the photo resist 39 is removed. Further, there is a case where the acoustic wave element is broken or degraded, because a voltage is implied to metal patterns such as the comb electrode 12 on the piezoelectric substrate 10 when the piezoelectric substrate 10 is subjected to a stress in the manufacturing process. For example, in a case where the sealing portion 23 having a large thickness is on the piezoelectric substrate 10 as shown in the conventional embodiment, the stress subjected to the piezoelectric substrate 10 is enlarged and the acoustic wave element tends to be broken.

SUMMARY OF THE INVENTION

The present invention has been made in view of the above circumstances, simplifies a manufacturing process and restrains a break or a degradation of an acoustic wave element in the manufacturing process.

According to an aspect of the present invention, there is provided a method of manufacturing an acoustic wave device including: forming a conductive pattern on a wafer made of a piezoelectric substrate having an acoustic wave element, the conductive pattern including a first conductive pattern, a second conductive pattern and a third conductive pattern, the first conductive pattern being continuously formed on a cutting region for individuating the wafer, the second conductive pattern being formed on an electrode region where a plated electrode is to be formed and being connected to the acoustic wave element, the third conductive pattern connecting the first conductive pattern and the second conductive pattern; forming an insulating layer on the wafer so as to have a opening on the second conductive pattern; forming the plated electrode on the second conductive pattern by providing an electrical current to the second conductive pattern via the first conductive pattern and the third conductive pattern; and cutting off and individuating the wafer along the cutting region. With the structure, it is possible to simplify the manufacturing process and restrain a break or a degradation of the acoustic wave element in the manufacturing process.

According to another aspect of the present invention, there is provided an acoustic wave device including: a piezoelectric substrate having an acoustic wave element thereon; an insulating layer that is provided on the piezoelectric substrate and covers the acoustic wave element; a penetrating electrode that passes through the insulating layer and is connected to the acoustic wave element; and a conductive pattern that is provided on the piezoelectric substrate, is connected to the penetrating electrode, and extends to an end portion of the piezoelectric substrate. With the structure, it is possible to simplify the manufacturing process and restrain a break or a degradation of the acoustic wave element in the manufacturing process.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 3A:
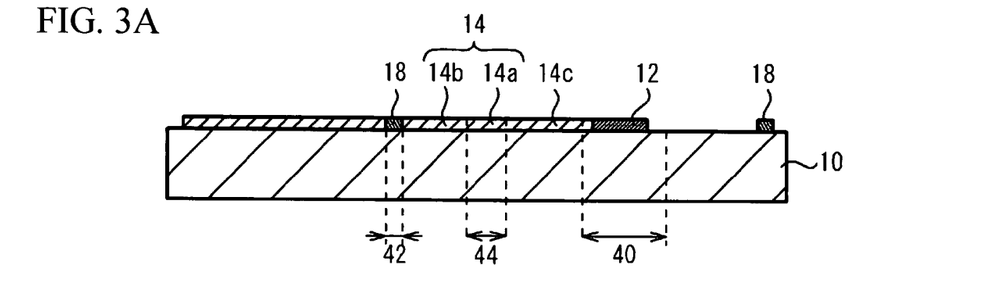
FIG. 3A through FIG. 3D illustrate a manufacturing process of an acoustic wave device in accordance with a first embodiment.

FIG. 3A through FIG. 4D illustrate a schematic cross sectional view showing a manufacturing method of an acoustic wave device in accordance with a first embodiment. As shown in FIG. 3A, there are formed the comb electrode 12 and a conductive pattern on the piezoelectric substrate 10 made of LiTaO$_3$ (lithium tantalate), with Al (aluminum)-Cu (copper). FIG. 5 illustrates a top view in this case. As shown in FIG. 5, the conductive pattern is composed of the first conductive pattern 18 continuously formed on the cutting region 42, a second conductive pattern 14a formed on the electrode region 44 where the plated electrode 28 (not shown) is to be formed, a third conductive pattern 14b connecting the first conductive pattern 18 and the second conductive pattern 14a, and a fourth conductive pattern 14c connecting the second conductive pattern 14a and the comb electrode 12.

Figure 5:
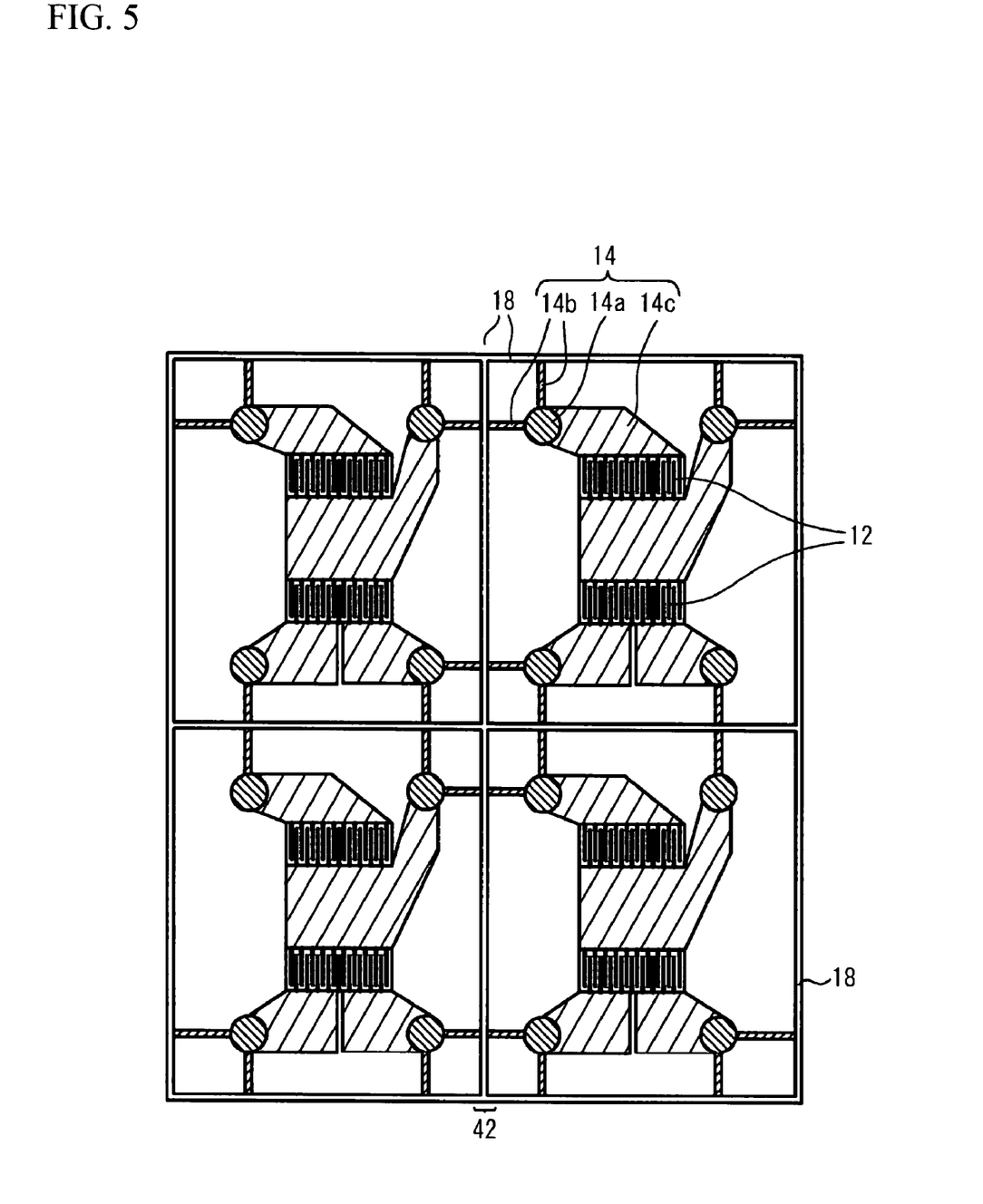
FIG. 5 illustrates a top view of the manufacturing process of the acoustic wave device in accordance with the first embodiment.
Figure 6:
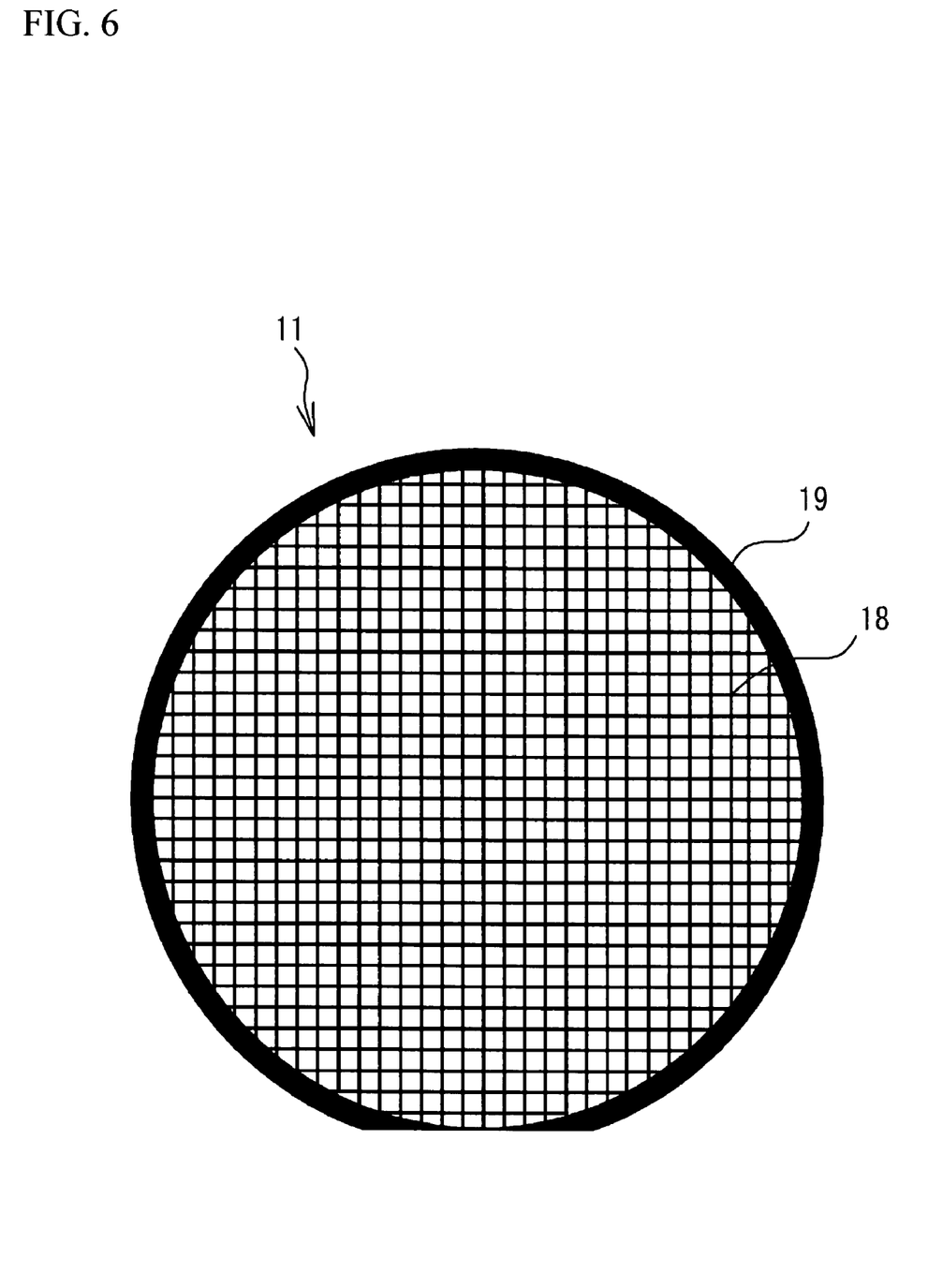
FIG. 6 illustrates a top view of a wafer.

FIG. 6 illustrates a top view of a wafer 11. As shown in FIG. 6, the first conductive pattern 18 is formed in a lattice pattern on the wafer 11. The first conductive pattern 18 is connected to a peripheral pattern 19 of the wafer 11. As shown in FIG. 5 and FIG. 6, the peripheral pattern 19 is connected to the second conductive pattern 14a through the first conductive pattern 18 and the third conductive pattern 14b.

Figure 3B:
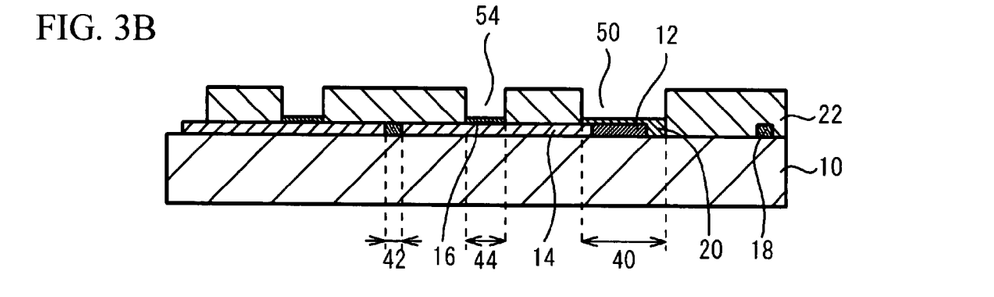

As shown in FIG. 3B, the protective membrane 20 made of a SiO$_2$ (silicon oxide) membrane is formed on the comb electrode 12, on the conductive patterns 14a through 14c, and on the first conductive pattern 18. A given region of the protective membrane 20 is removed. The barrier layer 16 made of Ti (titanium)/Au (gold) is formed on the conductive patterns 14a through 14c of the electrode region 44. An epoxy permanent negative resist is spin coated by 30 μm on the piezoelectric substrate 10. A non-covered portion 50 and the non-covered portion 54 are formed with an exposure technology. The non-covered portion 50 is a region of the functional region 40 not covered with a resin in which an acoustic wave propagates. The non-covered portion 54 is a region of the electrode region 44 not covered with a resin in which an acoustic wave propagates. In this way, the first sealing portion 22 is formed so that the functional region 40 and the electrode region 44 act as the non-covered portion 50 and the non-covered portion 54 respectively.

Figure 3C:
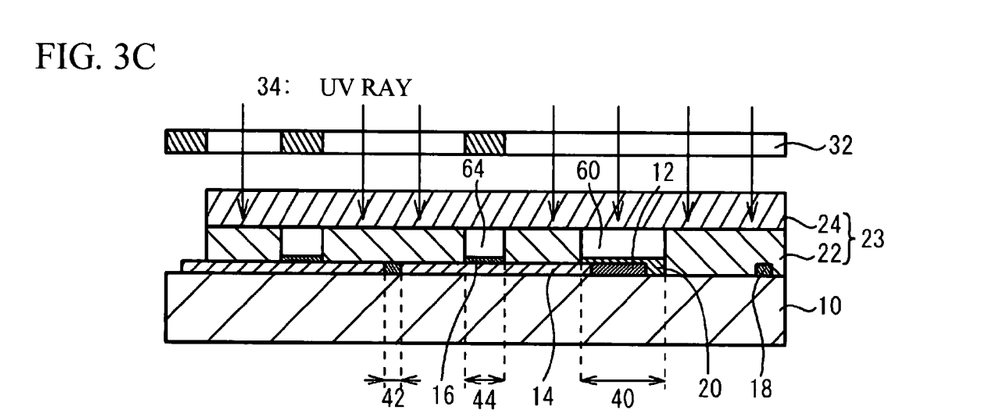
Figure 3D:
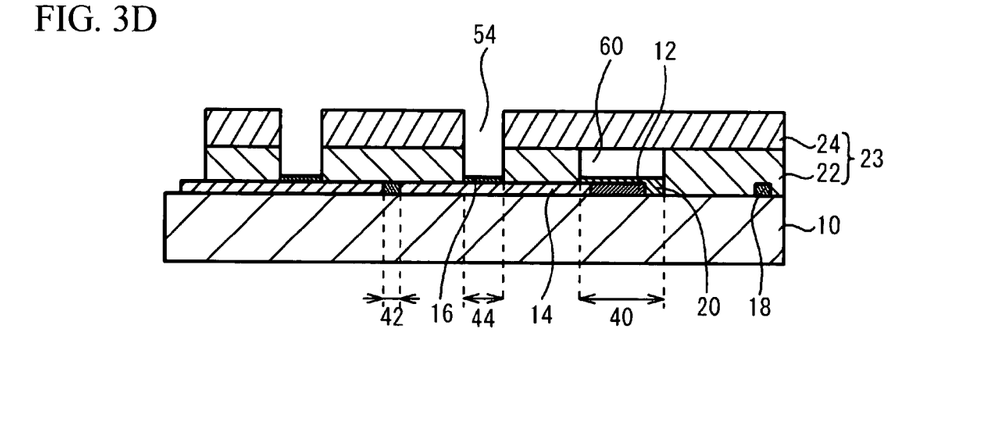

As shown in FIG. 3C, an epoxy permanent negative film resist having a thickness of 30 μm is adhered onto the first sealing portion 22 with a tenting method and acts as the second sealing portion 24. An ultra violet ray 34 is radiated to the second sealing portion 24 with use of a mask 32. As shown in FIG. 3D, the non-covered portion 54 of the first sealing portion 22 and the second sealing portion 24 is formed in the electrode region 44 with a development. The cavity 60 covered with the second sealing portion 24 is formed on the functional region 40. A post bake is performed at 250 degrees C. for an hour in order to thermally harden the second sealing portion 24.

Figure 4A:
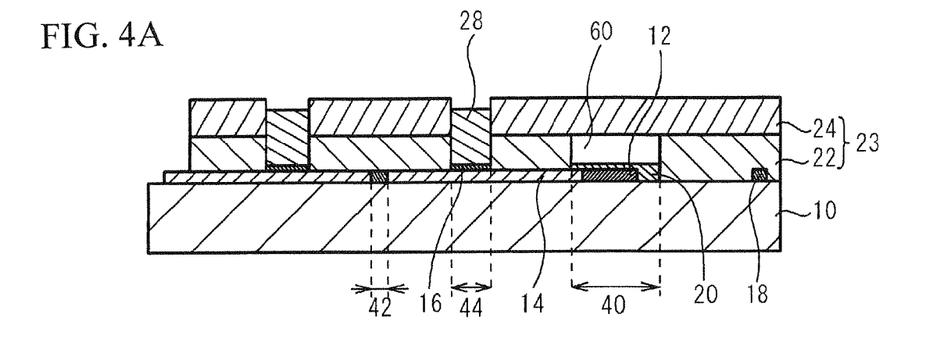
FIG. 4A through FIG. 4D illustrate the manufacturing process of the acoustic wave device in accordance with the first embodiment.

As shown in FIG. 4A, Ni (nickel) having a thickness of approximately 50 μm is formed on an inside of the non-covered portion 54 with an electroplating method. In the electroplating method, a wafer is arranged in a nickel sulfamate plating solution, and a voltage is implied to the peripheral pattern 19 shown in FIG. 6 and a current of 4 A/dm$^2$ is provided to the peripheral pattern 19. The current is provided to the second conductive pattern 14a via the peripheral pattern 19, the first conductive pattern 18 and the third conductive pattern 14b. A surface of the Ni is subjected to a flash plating of Au (gold), and the plated electrode 28 (a penetrating electrode) is formed made of Ni. A maximum of a height of the plated electrode 28 in the wafer face is larger than a minimum of that by approximately 10 μm.

Figure 4B:
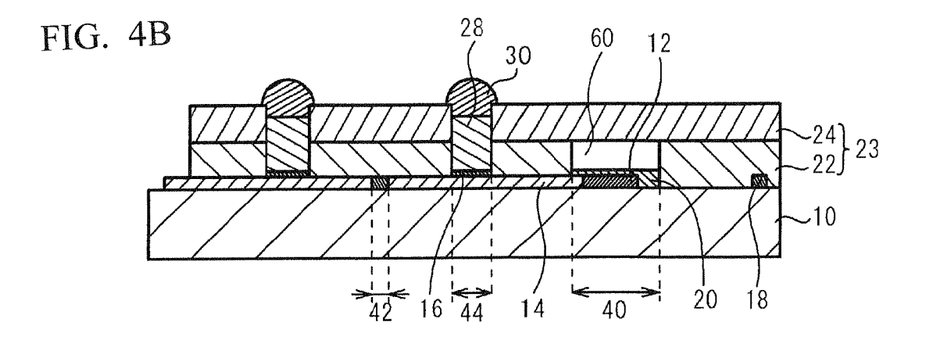

As shown in FIG. 4B a SnAgCu (tin silver copper) solder paste is mask-printed and reflowed on the plated electrode 28, and a solder ball 30 is formed.

Figure 4C:
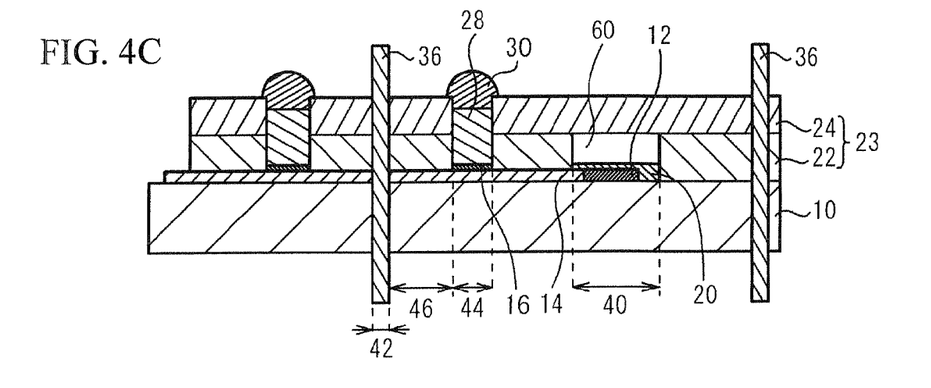
Figure 4D:
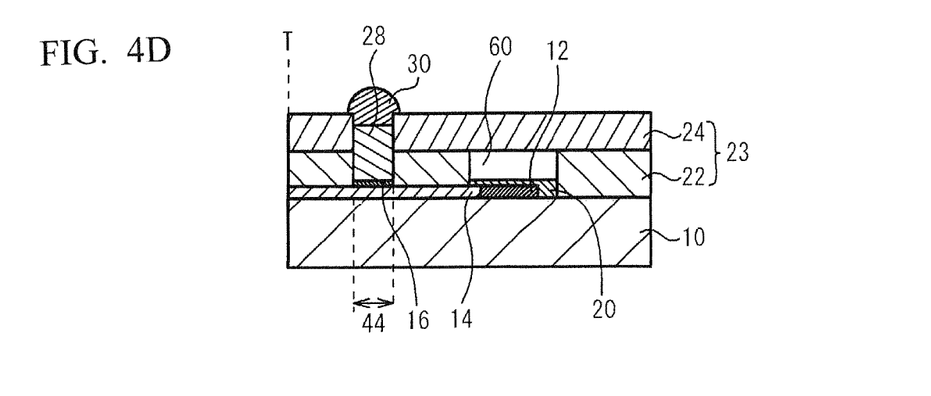
Figure 4E:
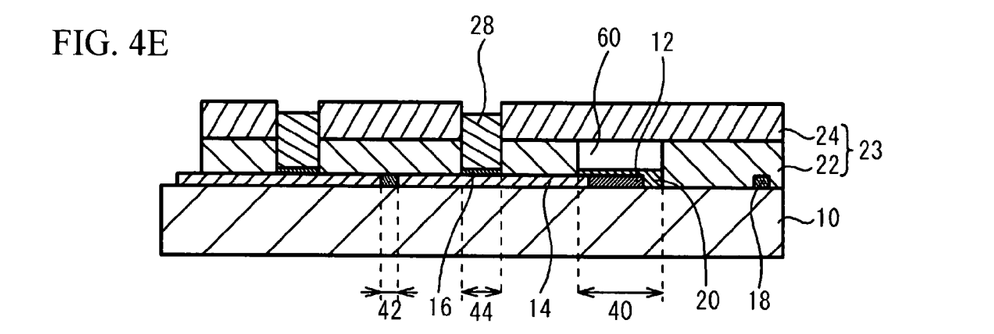
Figure 4F:
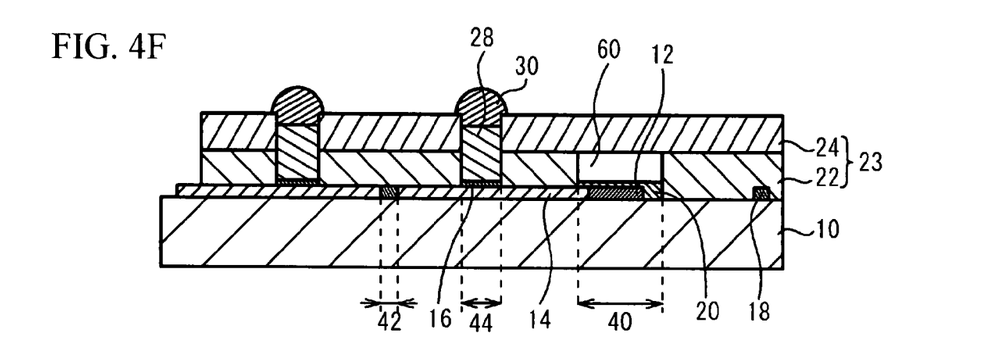
Figure 4G:
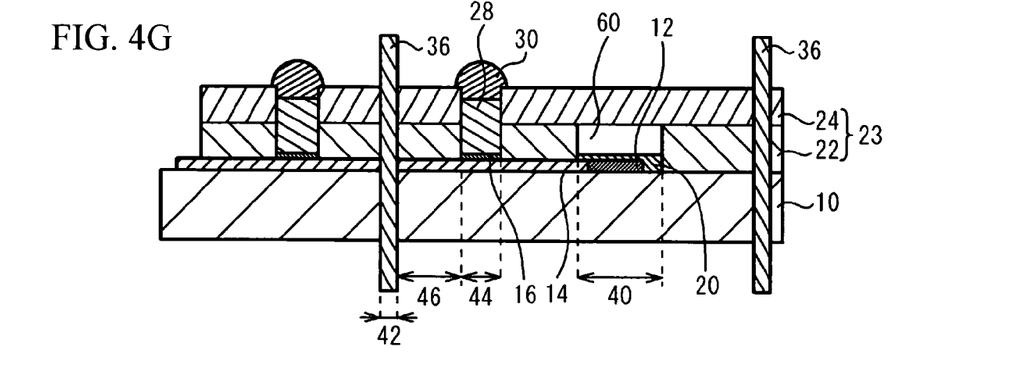
Figure 4H:
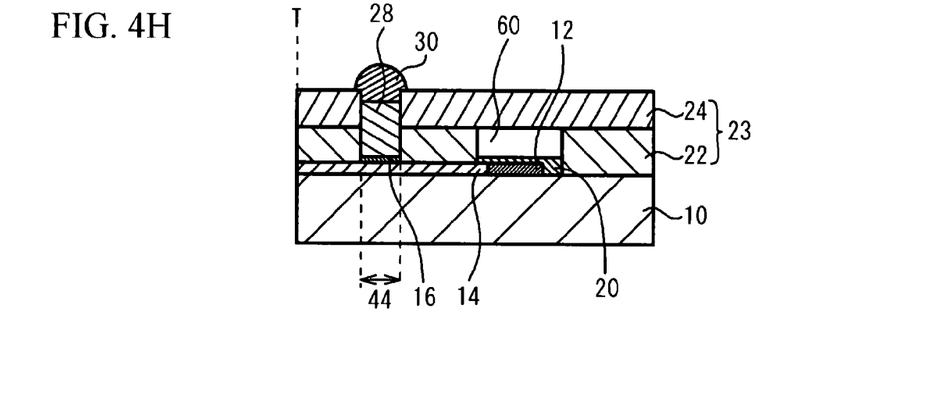

As shown in FIG. 4C a blade 36 cuts off the sealing portion 23 and the piezoelectric substrate 10 along the cutting region 42 with a dicing method. With the processes, the acoustic wave device is manufactured as shown in FIG. 4D. The acoustic wave device in accordance with the first embodiment is flip-chip mounted with the solder ball 30. This results in that the acoustic wave device can input and output an electrical signal of the acoustic wave element to outside. As shown in FIG. 4D the acoustic wave device is provided on the piezoelectric substrate 10, is connected to the plated electrode 28 (the penetrating electrode), and has the conductive patterns 14a through 14c extending to an end portion T of the piezoelectric substrate 10.

A manufacturing method in accordance with the first embodiment includes forming the conductive patterns including the first conductive pattern 18 continuously formed along the cutting region 42 on the wafer 11 made of the piezoelectric substrate 10, the second conductive pattern 14a and the barrier layer 16 provided on the electrode region 44, and the third conductive pattern 14b connecting the first conductive pattern 18 and the second conductive pattern 14a. As shown in FIG. 3D, the sealing portion 23 (an insulating layer) is formed on the wafer so as to include the non-covered portion 54 (an opening) on the second conductive pattern 14a. As shown in FIG. 4A, a current is provided to the second conductive pattern 14a via the first conductive pattern 18 and the second conductive pattern 14a, and the plated electrode 28 is formed on the second conductive pattern 14a. As shown in FIG. 4C, the wafer is cut off and individuated along the cutting region 42.

With the processes, it is possible to provide the current used for the formation of the plated electrode 28 via the conductive patterns 14a through 14c and the first conductive pattern 18 on the piezoelectric substrate 10, as shown in FIG. 4A. It is therefore not necessary to form the seed layer shown in the conventional embodiment. It is possible to simplify the manufacturing process. It is possible to restrain that the piezoelectric substrate 10 is damaged because of the removal of the seed layer and the photo resist. And it is possible to release an electrical charge via the conductive patterns 14a through 14c and the first conductive pattern 18, even if the comb electrode 12 is electrically discharged with a piezoelectric effect when the piezoelectric substrate 10 is subjected to a stress in the manufacturing process. It is therefore possible to restrain the break or the degradation of the acoustic wave element. Further, the first conductive pattern 18 is removed during the individuation, as shown in FIG. 4C. Therefore, the first conductive pattern 18 is left. And it is possible to avert a negative influence.

An insulating layer formed on the wafer may be silicon oxide, silicon nitride, aluminum oxide other than the sealing portion 23. However, in a case where the insulating layer is the sealing portion 23 sealing the acoustic wave element as shown in the first embodiment, the thickness of the sealing portion 23 is enlarged. This results in an enlargement of an aspect ratio of the non-covered portion 54. In this case, it is difficult to form the seed layer 38 in the non-covered portion 54 described in the conventional embodiment shown in FIG. 1B. In order to avert this problem, it is necessary to enlarge the non-covered portion 54, the electrode region 44. It is therefore difficult to downsize the acoustic wave device. On the other hand, it is not necessary to form the seed layer in the first embodiment. It is therefore possible to downsize the non-covered portion 54, the electrode region 44, and to downsize the acoustic wave device. And the stress subjected to the piezoelectric substrate 10 is enlarged because the sealing portion 23 is thick. Therefore, the acoustic wave element tends to be broken and degraded. It is effective to form the conductive patterns 14a through 14c and the first conductive pattern 18.

The sealing portion 23 may not include a cavity. However, the cavity 60 is formed and the second sealing portion 24 is formed on the cavity 60, in a case where the sealing portion 23 is formed so that the cavity is formed on the functional region of the acoustic wave element in which an acoustic wave propagates. It is necessary to enlarge the thickness of the sealing portion 23 in order to secure the strength of the sealing portion 23. This results in that the stress subjected to the piezoelectric substrate 10 is enlarged, and the acoustic wave element tends to be broken and degraded. It is therefore effective to form the conductive patterns 14a through 14c and the first conductive pattern 18, in a case where the sealing portion 23 has a cavity.

In FIG. 3A, the conductive patterns 14a through 14c and the first conductive pattern 18 may be formed separately. It is however preferable that the conductive patterns 14a through 14c and the first conductive pattern 18 are formed together in a viewpoint of simplifying the manufacturing process. Further, it is preferable that the comb electrode 12, the conductive patterns 14a through 14c and the first conductive pattern 18 are formed together.

In FIG. 3B, the barrier layer 16 may not be formed. It is however preferable that the plated electrode 28 is formed on the barrier layer 16 in order to restrain alloying of the conductive patterns 14a through 14c and the plated electrode 28.

A description is given of a process of forming the Ni on the non-covered portion 54 with an electroplating as a process of forming the plated electrode 28, with reference to FIG. 4A. The plated electrode 28 may be Ag (silver), Cu (copper), SnAg (tin silver) or SnAgCu (tin silver copper).

In the first embodiment, a description is given of the acoustic wave element having the piezoelectric substrate 10 made of $LiTaO_3$ (lithium tantalate). The piezoelectric substrate 10 may be made of $LiNbO_3$ (lithium niobate). The acoustic wave element may be a boundary acoustic wave element other than a surface acoustic wave element.

While the above description constitutes the preferred embodiments of the present invention, it will be appreciated that the invention is susceptible of modification, variation and change without departing from the proper scope and fair meaning of the accompanying claims.

The present application is based on Japanese Patent Application No. 2006-320892 filed Nov. 28, 2006, the entire disclosure of which is hereby incorporated by reference.

What is claimed is:

1. A method of manufacturing an acoustic wave device comprising:
    forming a conductive pattern on a wafer made of a piezoelectric substrate having an acoustic wave element,
    the conductive pattern including a first conductive pattern, a second conductive pattern, a third conductive pattern and a peripheral pattern,
    the first conductive pattern being continuously formed on a cutting region for individuating the wafer,
    the second conductive pattern being formed on an electrode region where a plated electrode is to be formed and being connected to the acoustic wave element,
    the third conductive pattern connecting the first conductive pattern and the second conductive pattern;
    the peripheral pattern being formed on a peripheral region of the wafer and being connected to the first conductive pattern;
    forming an insulating layer on the wafer so as to have an opening on the second conductive pattern;
    forming the plated electrode on the second conductive pattern by providing an electrical current to the second conductive pattern only via the peripheral pattern, the first conductive pattern and the third conductive pattern; and
    cutting off and individuating the wafer along the cutting region.

2. The method as claimed in claim 1, wherein the insulating layer is a sealing portion for sealing the acoustic wave element.

3. The method as claimed in claim 2, wherein the step of forming the insulating layer includes forming the sealing portion so that a cavity is formed above a functional region of the acoustic wave element in which an acoustic wave propagates.

4. The method as claimed in claim 1, wherein the step of forming the conductive pattern is a step of forming the conductive pattern and a comb electrode of the acoustic wave element together.

5. The method as claimed in claim 1 further comprising forming a barrier layer on the second conductive pattern, wherein the step of forming the plated electrode is a step of forming the plated electrode on the barrier layer.

* * * * *